(12) United States Patent
Celik et al.

(10) Patent No.: US 12,406,790 B2
(45) Date of Patent: Sep. 2, 2025

(54) SYSTEM AND METHOD FOR CONVERTING HELIUM BATH COOLING SYSTEM FOR A SUPERCONDUCTING MAGNET OF A MAGNETIC RESONANCE IMAGING SYSTEM INTO A SEALED CRYOGENIC SYSTEM

(71) Applicant: GE Precision Healthcare LLC, Waukesha, WI (US)

(72) Inventors: Dogan Celik, Florence, SC (US); Kabindra Ram Bhattarai, Columbia, SC (US); Yuye Jiang, Florence, SC (US); Richard Thomas Hackett, Sumter, SC (US); Charles Dudley Yarborough, Florence, SC (US); Stuart Paul Feltham, Florence, SC (US); Longzhi Jiang, Florence, SC (US); Harold Monroe James, Florence, SC (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 183 days.

(21) Appl. No.: 18/484,005

(22) Filed: Oct. 10, 2023

(65) Prior Publication Data

US 2025/0118474 A1 Apr. 10, 2025

(51) Int. Cl.
*H01F 6/04* (2006.01)
*G01R 33/34* (2006.01)
(Continued)

(52) U.S. Cl.
CPC .......... *H01F 6/04* (2013.01); *G01R 33/34023* (2013.01); *G01R 33/3403* (2013.01);
(Continued)

(58) Field of Classification Search
CPC .......... G01R 33/34023; G01R 33/3403; G01R 33/3804; G01R 33/3815; H01F 6/04
(Continued)

(56) References Cited

U.S. PATENT DOCUMENTS

2009/0293980 A1* 12/2009 Burke, II .................. F16L 9/02
138/146
2011/0160064 A1* 6/2011 Pfleiderer ............. F25D 19/006
165/185

(Continued)

FOREIGN PATENT DOCUMENTS

WO 2022068465 4/2022

OTHER PUBLICATIONS

U.S. Appl. No. 17/969,024, filed Oct. 19, 2022, Celik.

*Primary Examiner* — Roberto Velez
(74) *Attorney, Agent, or Firm* — Fletcher Yoder, P.C.

(57) ABSTRACT

A superconducting magnet system includes a coil support structure having a body, a superconducting magnet having a plurality of coils disposed about the body, and a helium vessel encompassing the coil support structure and the superconducting magnet. The superconducting magnet system includes a cooling system that includes a network of tubes disposed within the helium vessel and configured to transport helium within, wherein the network of tubes is retroactively thermally coupled to the plurality of coils. The cooling system includes a liquid helium storage system located within the helium vessel and a helium recondenser located outside the helium vessel. The cooling system includes one or more tubes coupling the helium storage system to the helium recondenser, wherein where the one or more tubes pass through the helium vessel is retroactively vacuum sealed to make the helium vessel a sealed helium vessel.

17 Claims, 9 Drawing Sheets

(51) Int. Cl.
    *G01R 33/38*     (2006.01)
    *G01R 33/3815*     (2006.01)
    *H01F 6/06*     (2006.01)

(52) U.S. Cl.
    CPC ..... *G01R 33/3804* (2013.01); *G01R 33/3815* (2013.01); *H01F 6/06* (2013.01)

(58) Field of Classification Search
    USPC .......................................... 324/224, 750.03
    See application file for complete search history.

(56) References Cited

U.S. PATENT DOCUMENTS

| | | | |
|---|---|---|---|
| 2014/0274721 A1* | 9/2014 | Calvert | G01R 33/3854 324/309 |
| 2016/0187435 A1* | 6/2016 | Jiang | G01R 33/3804 62/51.1 |
| 2016/0187439 A1* | 6/2016 | Lvovsky | G01R 33/543 324/309 |
| 2017/0250018 A1* | 8/2017 | Xu | H01F 6/04 |
| 2018/0144852 A1* | 5/2018 | Ito | F25B 9/14 |

\* cited by examiner

SYSTEM AND METHOD FOR CONVERTING HELIUM BATH COOLING SYSTEM FOR A SUPERCONDUCTING MAGNET OF A MAGNETIC RESONANCE IMAGING SYSTEM INTO A SEALED CRYOGENIC SYSTEM

BACKGROUND

The subject matter disclosed herein relates to a superconducting magnet for a magnetic resonance imaging (MRI) and, more particularly, a system and a method for converting helium bath cooling system for a superconducting magnet of an MRI system into a sealed cryogenic system.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

MRI systems may utilize superconducting magnets. Also, MRI systems may utilize liquid helium to operate. Sealed cryogenic systems utilize very small amounts of helium (e.g., a few liters versus several hundreds or even a couple of thousand liters utilized by bath cooling the superconducting magnet). All existing sealed cryogenic magnets use metal coil support structures (e.g., formers) that take advantage of higher thermal conductivity for temperature uniformity. Also, metal support structures make thermal management easier. Further, cartridge/magnet suspension is much easier with metal formers. Liquid helium may also be utilized in bath cooling the superconducting magnet (e.g., by filling a cyrogenic vessel with the superconducting magnet disposed inside (e.g. helium vessel) with liquid helium). In contrast to sealed cryogenic magnets, bath cooled magnets may utilize fiberglass composite structures which present many challenges. For example, the fiberglass composite structures have very low thermal conductivity that can create temperature gradients that eventually can cause a quench, larger outgassing, and emissivity. The larger outgassing and emissivity cause additional heat loads, which make it difficult to be part of a sealed system. Further, suspension attachment to the fiberglass composite support structures is challenging and may cause distortions in the fiberglass composite coil support structure and magnet homogeneity issues. Helium is a commodity whose price has been increasing due to global supply chain issues and increased demand. While there is a need to increase an efficiency of helium usage for a bath cooled magnet, it would be difficult due to issues with the fiberglass composite coil support structures.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a superconducting magnet system for a magnetic resonance imaging system is provided. The superconducting magnet system a coil support structure having a body. The superconducting magnet system also includes a superconducting magnet having a plurality of coils disposed about the body of the coil support structure. The superconducting magnet system further includes a helium vessel encompassing the coil support structure and the superconducting magnet. The superconducting magnet system further includes a cooling system. The cooling system includes a network of tubes disposed within the helium vessel and configured to transport helium within, wherein the network of tubes is retroactively thermally coupled to the plurality of coils. The cooling system also includes a liquid helium storage system located within the helium vessel. The cooling system further includes a helium recondenser located outside the helium vessel to recondense vapor helium to liquid helium. The cooling system further includes one or more tubes coupling the helium storage system to the helium recondenser, wherein where the one or more tubes pass through the helium vessel is retroactively vacuum sealed to make the helium vessel a sealed helium vessel, wherein the cooling system is configured to keep a uniform temperature between the sealed helium vessel and the plurality of coils.

In another embodiment, a method for cooling a superconducting magnet for a magnetic resonance imaging system is provided. The method includes filling a sealed cryogenic vessel with liquid helium until a first desired temperature is reached for cooling the superconducting magnet having a plurality of coils disposed about a body of a coil support structure, wherein the superconducting magnet is disposed within the sealed cryogenic vessel. The method also includes ceasing filling the sealed cryogenic vessel with the liquid helium upon reaching the first desired temperature. The method further includes utilizing a roughing vacuum pump coupled to the sealed cryogenic vessel to evacuate excess helium gas after ceasing filling the sealed cryogenic vessel with the liquid helium. The method even further includes activating a sealed cryogenic system including a network of tubes disposed within the sealed cryogenic vessel by flowing a cryogen through the network of tubes to cool the superconducting magnet to a second desired temperature, wherein the second desired temperature is lower than the first desired temperature.

In a further embodiment, a magnetic resonance imaging system is provided. The magnetic resonance imaging system includes a coil support structure having a body. The body of the coil support structure is made of fiberglass composite. The magnetic resonance imaging system also includes a superconducting magnet having a plurality of coils disposed about the body of the coil support structure. The magnetic resonance imaging system further includes a helium vessel encompassing the coil support structure and the superconducting magnet. The magnetic resonance imaging system also includes a cooling system. The cooling system includes a network of tubes disposed within the helium vessel and configured to transport helium within, wherein the network of tubes is retroactively thermally coupled to the plurality of coils. The cooling system further includes a liquid helium storage system located within the helium vessel. The cooling system further includes a helium recondenser located outside the helium vessel to recondense vapor helium to liquid helium. The cooling system even further includes one or more tubes coupling the helium storage system to the helium recondenser, wherein where the one or more tubes pass through the helium vessel is retroactively vacuum sealed to make the helium vessel a sealed helium vessel. The cooling system is configured to initially cool the superconducting magnet to a first desired temperature via filling the sealed helium vessel with liquid helium and to subsequently cool the superconducting magnet to a second desired temperature via the helium flowing through the network of tubes, wherein the second desired temperature is lower than the first desired temperature.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
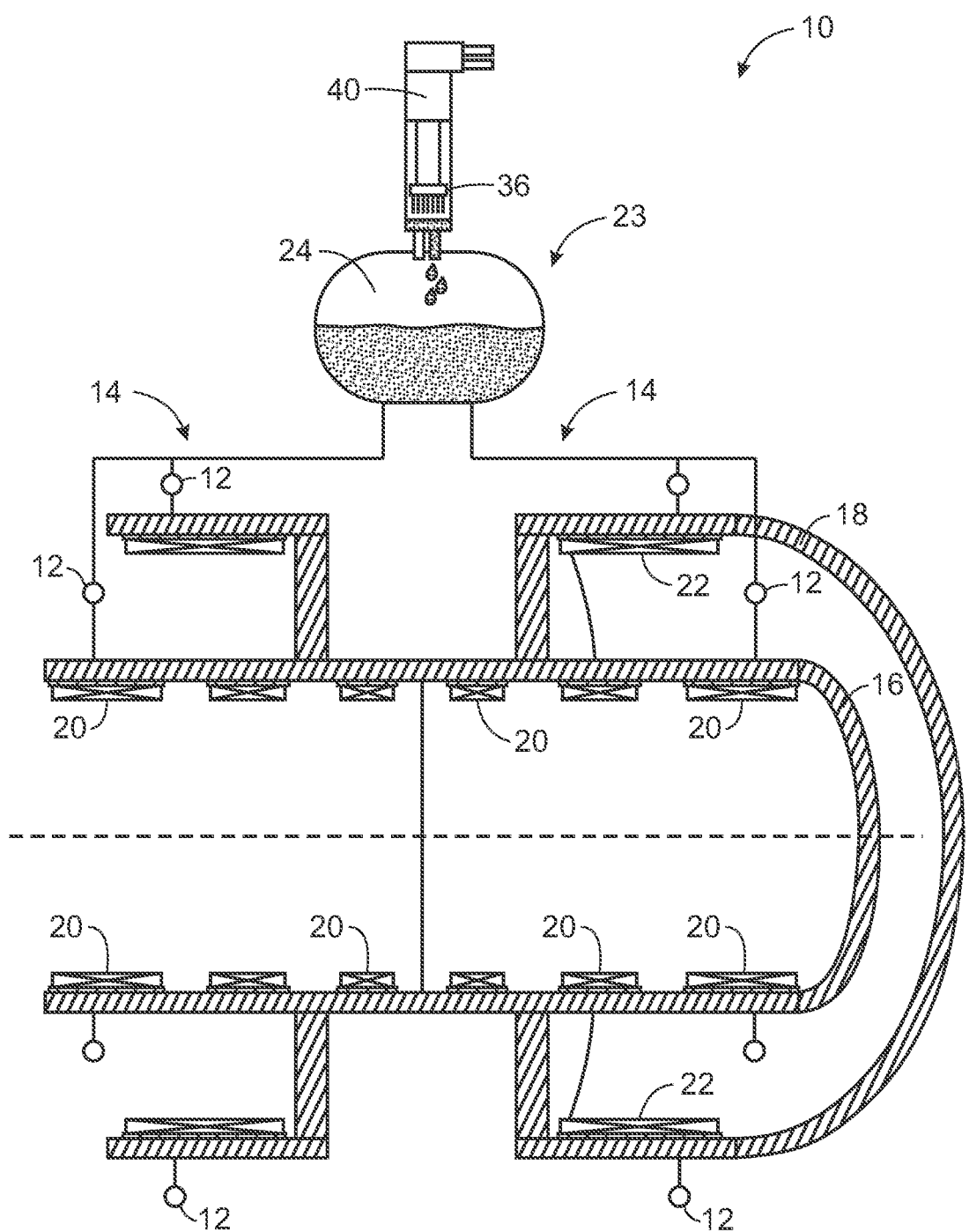
FIG. 1 is a side cross-sectional view of a portion of cooling system for a magnet resonance imaging machine, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides a system and a method for converting helium bath cooling system for a superconducting magnet of an MRI system into a sealed low cryogenic system. In particular, a superconducting magnet system includes a coil support structure (e.g., former) having a body. In certain embodiments, the coil support structure may be made of a fiberglass composite. The superconducting magnet system also includes a superconducting magnet having a plurality of coils disposed about the body of the coil support structure. The superconducting magnet system further includes a helium vessel encompassing the coil support structure and the superconducting magnet. The superconducting magnet system further includes a cooling system. The cooling system includes a network of tubes disposed within the helium vessel and configured to transport helium within, wherein the network of tubes is retroactively thermally coupled to the plurality of coils. The cooling system also includes a liquid helium storage system located within the helium vessel. The cooling system further includes a helium recondenser located outside the helium vessel to recondense vapor helium to liquid helium. The cooling system further includes one or more tubes coupling the helium storage system to the helium recondenser, wherein where the one or more tubes pass through the helium vessel is retroactively vacuum sealed to make the helium vessel a sealed helium vessel, wherein the cooling system is configured to keep a uniform temperature between the sealed helium vessel and the plurality of coils.

In certain embodiments, in order to create the sealed helium vessel, the superconducting magnet system includes a respective bellows located where each respective tube of the one or more tubes pass through the helium vessel, wherein each respective bellows forms a vacuum seal and is coupled to the respective tube of the one or more tubes, and the one or more tubes are rigid. In certain embodiments, in order to create the sealed helium vessel, a respective bi-metallic interface disposed about each tube of the one or more tubes where each respective tube of the one or more tubes passes through the helium vessel, wherein each respective bi-metallic interface forms a vacuum seal, and the one or more tubes are flexible. In certain embodiments, each respective bi-metallic interface includes an inner metal layer that interfaces with the respective tube and an outer metal layer that interfaces with the helium vessel, and the inner metal layer is made of a different metallic material than the outer metal layer.

In certain embodiments, each coil of the plurality of coils is thermally coupled to a respective tube of the network of tubes via a thermocoupling assembly, wherein the thermocoupling assembly includes a flat thermoconductive metal strap (e.g., flat copper strap) disposed on a respective coil, a thermoconductive metallic wire overwrap (e.g., copper wire overwrap) wound about both a portion of the flat thermoconductive metallic strap and the respective coil, and ends of the flat thermoconductive metal strap are coupled to a thermoconductive metallic plate (e.g., copper plate) coupled to the respective tube. In certain embodiments, the thermocoupling assembly includes a thermoconductive metallic sheet (e.g., copper sheet) wrapped around the respective tube, and the thermoconductive metallic plate is coupled to the thermoconductive metallic sheet. In certain embodiments, each coil of the plurality of coils is thermally coupled to a respective tube of the network of tubes via a thermocoupling assembly, wherein the thermocoupling assembly includes a flat thermoconductive metallic strap (e.g., flat copper strap) disposed on a respective coil, a thermoconductive metallic plate (e.g., copper plate) disposed about a portion of the flat thermoconductive metallic strap, and ends of the flat thermoconductive metallic strap are coupled to an additional thermoconductive metallic plate (e.g., copper plate) coupled to the respective tube. In certain embodiments, wherein the thermocoupling assembly includes a thermoconductive metallic sheet wrapped around the respective tube, and the additional thermoconductive metallic plate is coupled to the thermoconductive metallic sheet.

In certain embodiments, the superconducting magnet system includes a superconducting switch configured to operate at a temperature of 80 Kelvin or less, wherein the superconducting switch is both located within and thermally isolated from the helium vessel, the superconducting switch is configured to switch between a resistive mode and a superconducting mode, and the superconducting switch is thermally coupled to a respective tube of the network of tubes. In certain embodiments, the superconducting switch includes a blanket insulation disposed about a body of the switch and configured to thermally isolate the superconducting switch from the helium vessel, the superconducting switch includes a thermoconductive metallic sheet (e.g., copper sheet) disposed about the blanket insulation and thermally connected to the respective tube, and wherein the blanket insulation and the thermoconductive metallic sheet are configured to keep convection from being generated by the superconducting switch during ramping of the superconducting magnet. In certain embodiments, power leads coupled to the superconducting switch, wherein the power leads comprise a high temperature superconducting wire coupled to a heat sink located outside the helium vessel, wherein an end of the high temperature superconducting wire coupled to the heat sink is electrically isolated, and wherein the power leads comprise a low temperature superconducting wire having a first end coupled to the heat sink and a second end coupled to the superconducting switch, and the low temperature superconducting wire passes from outside the helium vessel through an electrically isolated feedthrough into the helium vessel.

With the modifications noted above, the superconducting magnet can be cooled utilizing a combination of a cooling circuit thermoconductively directly coupled to the coils and helium bath cooling. A method for cooling a superconducting magnet for a magnetic resonance imaging system includes filling a sealed cryogenic vessel with liquid helium until a first desired temperature is reached for cooling the superconducting magnet having a plurality of coils disposed about a body of a coil support structure, wherein the superconducting magnet is disposed within the sealed cryogenic vessel. The method also includes ceasing filling the sealed cryogenic vessel with the liquid helium upon reaching the first desired temperature. The method further includes utilizing a roughing vacuum pump coupled to the sealed cryogenic vessel to evacuate excess helium gas after ceasing filling the sealed cryogenic vessel with the liquid helium. The method even further includes activating a sealed cryogenic system including a network of tubes disposed within the sealed cryogenic vessel by flowing a cryogen (e.g., helium) through the network of tubes to cool the superconducting magnet to a second desired temperature, wherein the second desired temperature is lower than the first desired temperature. In certain embodiments, the method includes filling the tube network with the cryogen and sealing it prior to cooling down the superconducting magnet. The pressure in the sealed cryogenic vessel after evacuating the excess helium gas generates internal convection to ensure a uniform temperature distribution between the plurality of coils and the sealed cryogenic vessel.

The disclosed embodiments provide for converting existing bath cooled magnets (especially those with fiberglass composite structures) to sealed low cryogen systems while keeping the support structure, coil configuration, and cryostat (e.g., helium vessel) nearly intact, while replacing a main switch of the superconducting magnet with a switch configured for low cryogen operation and adding superconducting current leads. In addition, the disclosed embodiments provide for a liquid helium network that allows the cooling of the sealed helium vessel directly. Further, the disclosed embodiments provide for feedthrough configurations (e.g., for tubes through the sealed helium vessel) that eliminate vibration transmission from the coldhead and that compensate for thermal expansion differentials between the materials involved. Even further, the disclosed embodiments enable a faster cooldown for the superconducting magnet disposed in the sealed cryogenic vessel (e.g., from 1 to 3 weeks to 1 to 3 days) which is equivalent to cooldown for a bath cooled magnet. Still further, the disclosed embodiments reduces helium consumption (e.g., due to eliminating helium addition during a lifetime of the magnet) and, thus, the costs associated with consumption of helium. Yet further, the disclosed embodiments eliminate the need for a quench vent pipe.

Referring now to FIG. 1, a portion of a cooling system 10 for a superconducting magnet of a MRI machine is illustrated. The portion of the cooling system 10 is retroactively fitted to the MRI machine originally configured for utilizing helium bath cooling of the superconducting magnet. As shown therein, the cooling system 10 includes a plurality of cooling tubes 12 (e.g., a network of tubes 12 forming a sealed cryogenic system), or other suitable cooing paths, with liquid helium circulating within the cooling tubes 12. The cooling tubes 12 define a primary cooling loop 14. The cooling tubes 12 are retroactively thermally coupled to a main former or support shell or body 16 (e.g., main coil support) and, in an embodiment, may also be thermally coupled to a shield former (e.g., bucking former) or support shell or body 18 (e.g., shield coil support) that encompasses the main former 16. The main former 16 and shield former 18 support or maintain the position of main MRI magnet coils 20 and shielding MRI magnet coils 22 (also referred to as bucking coils), respectively, in a manner heretofore known in the art. For example, the main magnet coils 20 may be shrink fit and bonded inside the main former 16, which may be a cylindrical metal coil former, to thereby provide thermal contact therebetween. Likewise the shield magnet coils 22 may be shrink fit and bonded inside the shield former 18, which may be a cylindrical metal coil former, to thereby provide thermal contact therebetween. Other types of coils may be provided, for example, epoxied coils. In an embodiment the main magnet coils 20 and the magnet shielding coils 22 may be formed from any material capable of producing a superconducting magnet, such as from niobium-titanium (NbTi), niobium-tin (Nb3Sn) or magnesium-di-boride (MgB2). As described in greater detail below, the cooling tubes 12 may be thermally coupled directly to the coils 20, 22 on the formers 16, 18.

Figure 2:
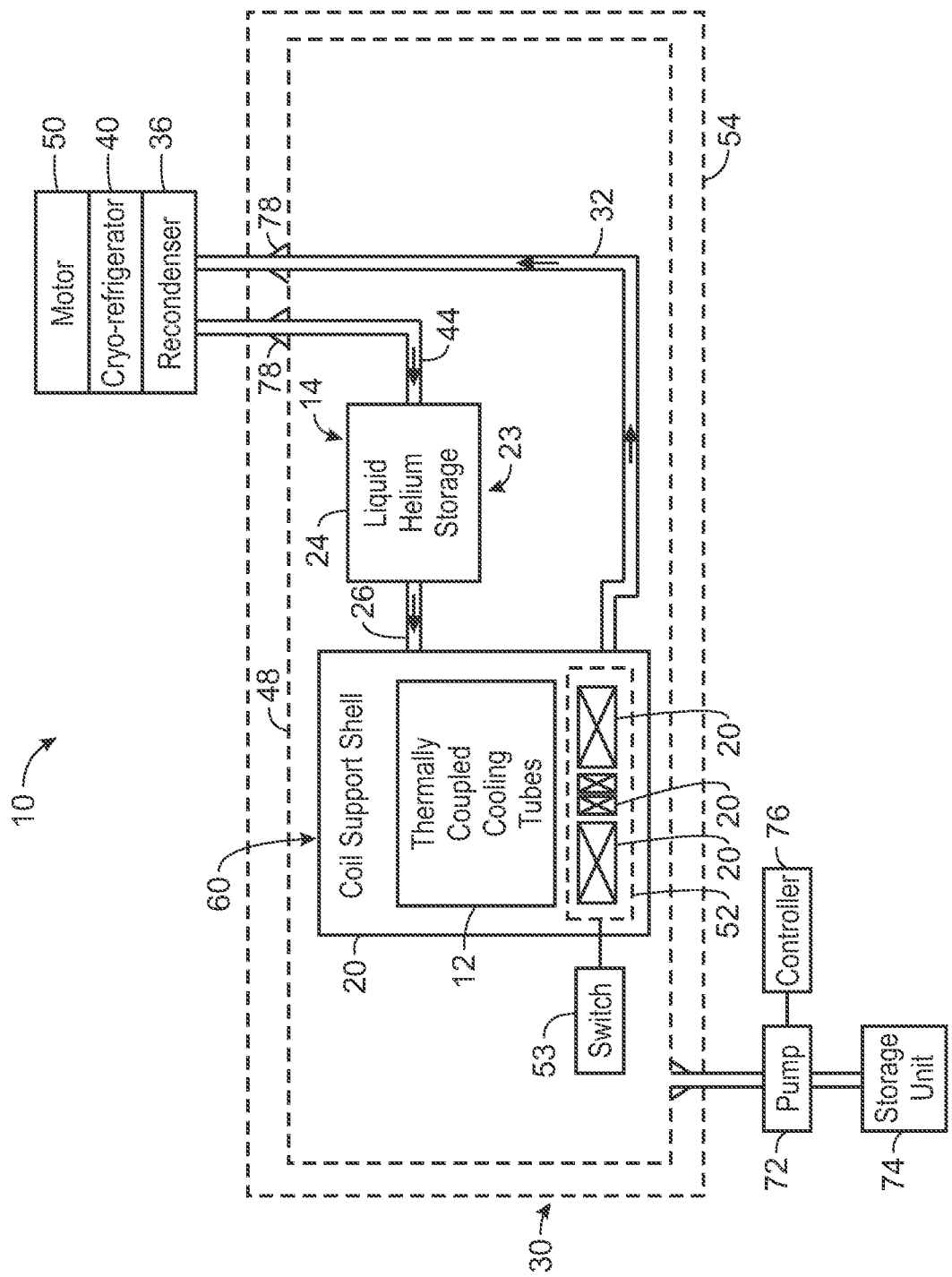
FIG. 2 is a schematic diagram of a cooling system for a magnet resonance imaging machine (including the portion of the cooling system in FIG. 1), in accordance with aspects of the present disclosure.

As further illustrated in FIG. 2 (which illustrates an additional portion of the cooling system 10), the various embodiments of the present invention may be implemented as part of an MRI superconducting magnet system 30, wherein the cooling may be provided via a two stage cooling arrangement. For example, initial cooling may be provided via a helium bath and then subsequent cooling may be provided via circulating liquid helium through the cooling tubes.

The coil formers 16, 18 provide a cold mass support structure that maintain the position of or support the magnetic coils 20, 22, respectively (shielding magnet coils 22 not shown in FIG. 2). The coil formers 16, 18 are made of a fiberglass composite material. In certain embodiments, the coil formers 16, 18 may be formed from a thermally conductive material (e.g., aluminum). The cooling tubes 12, which may be formed from any suitable metal (e.g., copper, stainless steel, aluminum, etc.) are in fluid communication with a liquid cryogen storage system 23 having one or more liquid cryogen storage tanks 24. The cryogen storage system 23 contains a liquid cryogen used in the closed loop cooling system 10 to cool a cold mass 60, including magnet coils 20, 22. In an embodiment, the cryogen is liquid helium. The fluid communication between the cooling tubes 12 and the liquid helium storage tank(s) 24 may be provided by one or more fluid passageways 26 (e.g., fluid tubes, conduits, etc.). Thus, the one or more storage tanks 24 provide the liquid helium that flows through the cooling tubes 12 to cool the magnet coils 20, 22 by removing heat.

Collectively, the assembly of magnet coils 20 and/or 22, the coil formers/support structure 16 and/or 18 and the liquid cryogen storage tanks 24 form a cold mass 60. As discussed in detail below, this cold mass 60 is cooled to target temperature. As used herein, "target temperature" means a cryogenic temperature sufficient to enable superconducting operation. In an embodiment, the target temperature is approximately 4 K. As used herein "cold mass" means any structure that is cooled to the target temperature during normal operation via the cooling loop 14. In the illustrated embodiment, the cooling loop 14 contains no venting.

As best illustrated in FIG. 2, in an embodiment, the cooling tubes 12 may be in fluid communication with a vapor return manifold or passageway 32 (e.g., tubes or conduits coupled to a recondenser 36. receives helium vapor from the cooling tubes 12 that removes heat from the magnet coils 20, 22 and forms part of the closed loop cooling system.

The liquid helium storage tanks 24 are in fluid communication with a cryorefrigerator 40 that includes the recondenser 36. In various embodiments, the recondenser 36 operates to form a free convection circulation loop to cool the magnet coils 20, 22 and coil support shells 16, 18 to a cryogenic temperature, as well as fills the liquid helium storage tanks 24 with liquid helium via one or more passageways 44. The cryorefrigerator 40 may be a coldhead or other suitable cryocooler. The cryorefrigerator 40 also includes a motor 50.

As illustrated in FIG. 2, the cryorefrigerator 40 in various embodiments includes the recondenser 36 at a lower end of the cryorefrigerator 40 that recondenses boiled off helium gas received from the vapor return manifold/passageway 32 in parallel with the helium gas storage system 34. The recondenser 36 allows for of liquid helium to the liquid helium reservoir 24.

The magnet coils 20, which in various embodiments are molded coils, form a main superconducting magnet 52 that is controlled during operation of the MRI system as is known in the art to acquire MRI image data. Additionally, during operation of the MRI system, liquid helium travelling through the thermally coupled cooling tubes 12 cools the superconducting magnet 52. The superconducting magnet 52 may be cooled, for example, to a superconducting temperature, such as 4.2 Kelvin (K). A portion of the cooling process may include the recondensing of boiled off helium gas to liquid by the recondenser 36 and returned to the liquid helium tank 24, as well as cooling of the boiled off helium.

In addition to cooling via the circulation of liquid helium through cooling tubes that are thermally connected to the magnet, cooling may be provided by immersing the superconducting magnet coils in a bath of liquid helium. In various embodiments, once cooled to operating temperature, the magnet coils may be cooled by thermal conduction and/or by thermosiphoning cooling. As will be readily appreciated, however, whether cooling is effected through the circulation of a liquid cryogen through a cooling loop that is in thermal communication with the magnet, or through the immersion of magnet coils in a bath of liquid cryogen, the coil formers/support structure, magnet coils and/or liquid cryogen reservoir form a cold mass 60 having a temperature of approximately 4.2 K, which provides for superconducting operations.

As depicted, the coil support shell 20, the cooling tubes 12, and the liquid helium storage system 23 are disposed within a cryogenic vessel 48 (e.g., helium vessel). The cooling tubes 12 may be thermally coupled to the cryogenic vessel 48. The cryogenic vessel 48 may be partially filled with liquid helium to cool the main superconducting magnet 52 as noted above. The cryogenic vessel 48 may disposed within a thermal shield 54 (e.g., a thermally isolating radiation shield). The cryorefrigerator 40 (including the motor 50 and the recondenser) 36) are located outside both the cryogenic vessel 48 and the thermal shield 54. The temperature at the thermal shield 54 may be approximately 50 K.

A pump 72 (e.g., vacuum or roughing pump) is connected to the cryogenic vessel 48 to allow helium gas to be pumped directly out of the cryogenic vessel 48. For example, during pump down and cooling down, helium gas may be pumped out to reduce the pressure (e.g., as to low as tens of millitorr) and, thus, the temperature within the cryogenic vessel 48. The pump 72 may be coupled to a helium gas storage unit 74. A controller 76 (e.g., having processing circuitry and memory circuitry) is connected to the pump 72 to control the operation of the pumping, for example, to control the level of pressure within the cryogenic vessel 48 during ramping. For example, the controller 76 may be connected to a temperature sensing device (not shown) or pressure sensing device (not shown) that measure the temperature of and pressure in the cryogenic vessel 48, respectively. Thus, the controller 76 may control the pump 72 such that reduced pressure in the helium vessel is provided during ramping.

As noted above, the cooling system 10 for the superconducting magnet 52 is retrofitted to form a sealed low cryogenic system. Besides providing the cooling tubes 10, the retrofit includes providing for feedthrough configurations that eliminate vibration transmission from the coldhead and that compensate for thermal expansion differentials between the materials involved. This may include forming a vacuum seal 78 between any tube or conduit that extends between the recondenser 36 and the liquid storage system 23 or any other location within the cryogenic vessel 48 (e.g., passageways 26, 32). providing for feedthrough configurations (e.g., for tubes through the sealed helium vessel) that eliminate vibration transmission from the coldhead and that compensate for thermal expansion differentials between the materials involved. Other tubes or conduits coupled to the cryogenic vessel 48 may be vacuum sealed where they pass thru the cryogenic vessel 48. Adding the vacuum seals makes the cryogenic vessel 48 a sealed cryogenic vessel 48.

The superconducting magnet 52 is electrically coupled to a superconducting switch 53. Retrofitting the cooling system 10 includes replacing the original main superconducting switch with the superconducting switch 53 that is configured to operate at a temperature of 80 Kelvin or less. As described in greater detail below, the superconducting switch 53 is both located within and thermally isolated from the helium vessel 48. The superconducting switch 53 is configured to switch between a resistive mode and a superconducting mode. In addition, the superconducting switch 53 is thermally coupled to a respective tube 10 of the cooling tubes 10. Further, a high temperature superconducting current leads may be provided and coupled to the superconducting switch 53.

Figure 3:
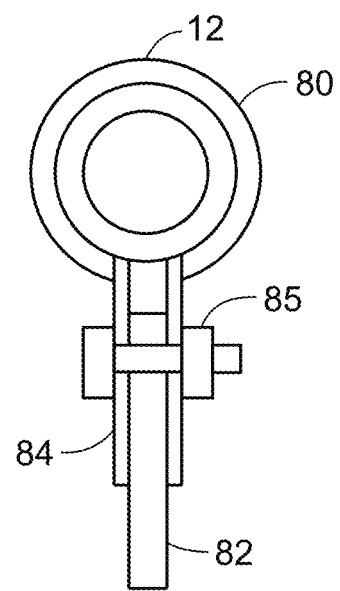
FIG. 3 is a cross-sectional view of a cooling tube of the cooling system in FIG. 1, in accordance with aspects of the present disclosure.

FIG. 3 is a cross-sectional view of a cooling tube 13 of the cooling system 10 in FIG. 1. As noted above, the cooling tube 12 may be formed from any suitable metal (e.g., copper, stainless steel, aluminum, etc.). As depicted, the cooling tube 12 is configured for thermocoupling to a coil of the superconducting magnet. In particular, a thermoconductive sheet 80 made of metal (e.g., copper) is wrapped or disposed about the cooling tube 12. The thermoconductive sheet 80 is configured maximizes the heat transfer surface for the cooling tube 12. A thermoconductive plate 82 (e.g., copper plate) is coupled to and flanked by ends 84 of the thermoconductive sheet 80 via a fastener 85 (e.g., bolt) that passes through the ends 84 and the thermoconductive plate 82. The thermoconductive plate 82 may also be soldered to the ends 84 of the thermoconductive sheet 82. The thermoconductive plate 82 acts as a thermoconductive conduit between the cooling tube 12 and the coil of the superconducting magnet. A single cooling tube 12 may be coupled to multiple coils of the superconducting magnet. Thermocoupling directly of the coils to the superconducting magnet helps form a sealed cryogenic system since the liquid helium is kept inside the cooling tubes 12.

Figure 4:
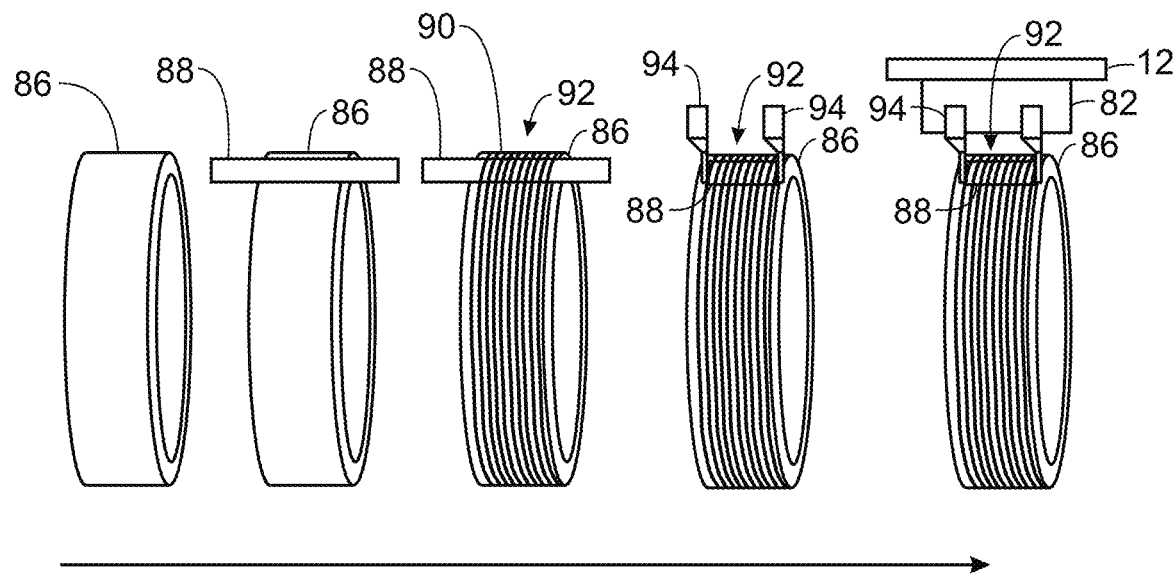
FIG. 4 is a schematic diagram illustrating a process for thermocoupling a coil of a superconducting magnet to the cooling tube in FIG. 3 (e.g., using metal wire overwrap), in accordance with aspects of the present disclosure.

FIG. 4 is a schematic diagram illustrating a process for thermocoupling a coil 86 (e.g., coil 20 or 22 in FIG. 1) of a superconducting magnet to the cooling tube 12 in FIG. 3 (e.g., using metal wire overwrap). The coil 86 is configured to be disposed on a former made of fiberglass composite. A flexible thermoconductive strap or braid 88 (e.g., made of a metal such as copper) is disposed or laid on the top of the coil 86. Then a thermoconductive wire overwrap 90 (e.g., made of a metal such as copper) is wound directly on top (and around) the coil 86 to compress the flexible thermoconductive strap or braid 88 against the coil 86 to form a better thermal contact. In certain embodiments, a thermal grease can be disposed between the thermoconductive strap or braid 88 and the coil 86 to increase efficiency. The thermoconductive strap or braid 88 and the thermoconductive wire overwrap 90 from a thermocoupling assembly 92 to directly thermocouple the coil 86 to the cooling tube 12. Ends 94 of the thermoconductive strap or braid 88 are folded up and connected to the thermoconductive plate 82 coupled to the cooling tube 12. This configuration takes advantage of the very high heat transfer along the hoop direction to minimize the surface area of the thermoconductive strap or braid 88. Brazing or soldering between the metal (e.g., copper) parts and the cooling tube 12 can be utilized to increase the heat transfer efficiency.

Figure 5:
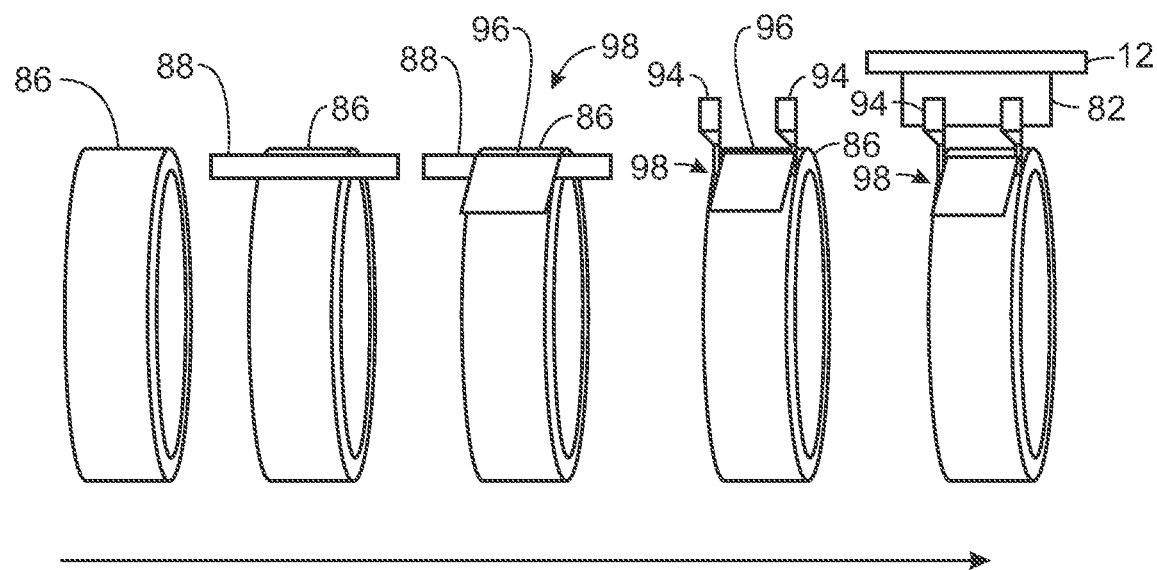
FIG. 5 is a schematic diagram illustrating a process for thermocoupling a coil of a superconducting magnet to the cooling tube in FIG. 3 (e.g., using conforming metal plate), in accordance with aspects of the present disclosure.

FIG. 5 is a schematic diagram illustrating a process for thermocoupling the coil 86 (e.g., coil 20 or 22 in FIG. 1) of a superconducting magnet to the cooling tube 12 in FIG. 3 (e.g., using conforming metal plate). The coil 86 is configured to be disposed on a former made of fiberglass composite. A flexible thermoconductive strap or braid 88 (e.g., made of a metal such as copper) is disposed or laid on the top of the coil 86. Then, a thermoconductive conforming plate 96 (e.g., made of a metal such as copper) is fastened (e.g., bolted) to flanges of the former (see FIG. 6) on top of a portion of the thermoconductive strap or braid 88 to compress the flexible thermoconductive strap or braid 88 against the coil 86 to form a better thermal contact. In certain embodiments, a thermal grease can be disposed between the thermoconductive strap or braid 88 and the coil 86 to increase efficiency. The thermoconductive strap or braid 88 and the thermoconductive conforming plate 96 from a thermocoupling assembly 98 to directly thermocouple the coil 86 to the cooling tube 12. Ends 94 of the thermoconductive strap or braid 88 are folded up and connected to the thermoconductive plate 82 coupled to the cooling tube 12. This configuration takes advantage of the very high heat transfer along the hoop direction to minimize the surface area of the thermoconductive strap or braid 88. Brazing or soldering between the metal (e.g., copper) parts and the cooling tube 12 can be utilized to increase the heat transfer efficiency.

Figure 6:
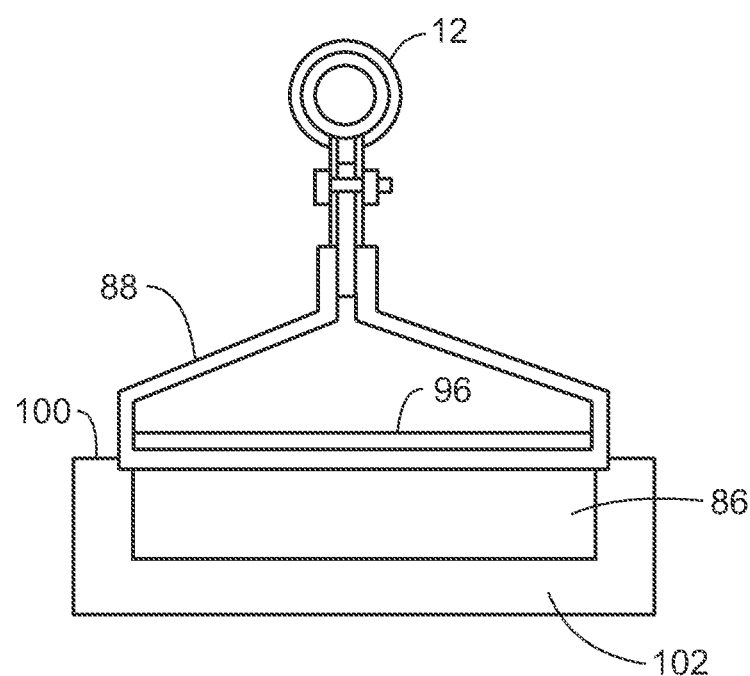
FIG. 6 is a cross-sectional view of a cooling tube thermally coupled directly to the coil in FIG. 5, in accordance with aspects of the present disclosure.

FIG. 6 is a cross-sectional view of the cooling tube thermally coupled directly to the coil 86 in FIG. 5. As depicted, the thermoconductive conforming plate 96 (e.g., made of a metal such as copper) is fastened to flanges 100 of the former 102 (e.g., coil former 16 or 18 in FIG. 1) on top of a portion of the thermoconductive strap or braid 88 to compress the flexible thermoconductive strap or braid 88 against the coil 86 to form a better thermal contact.

Figure 7:
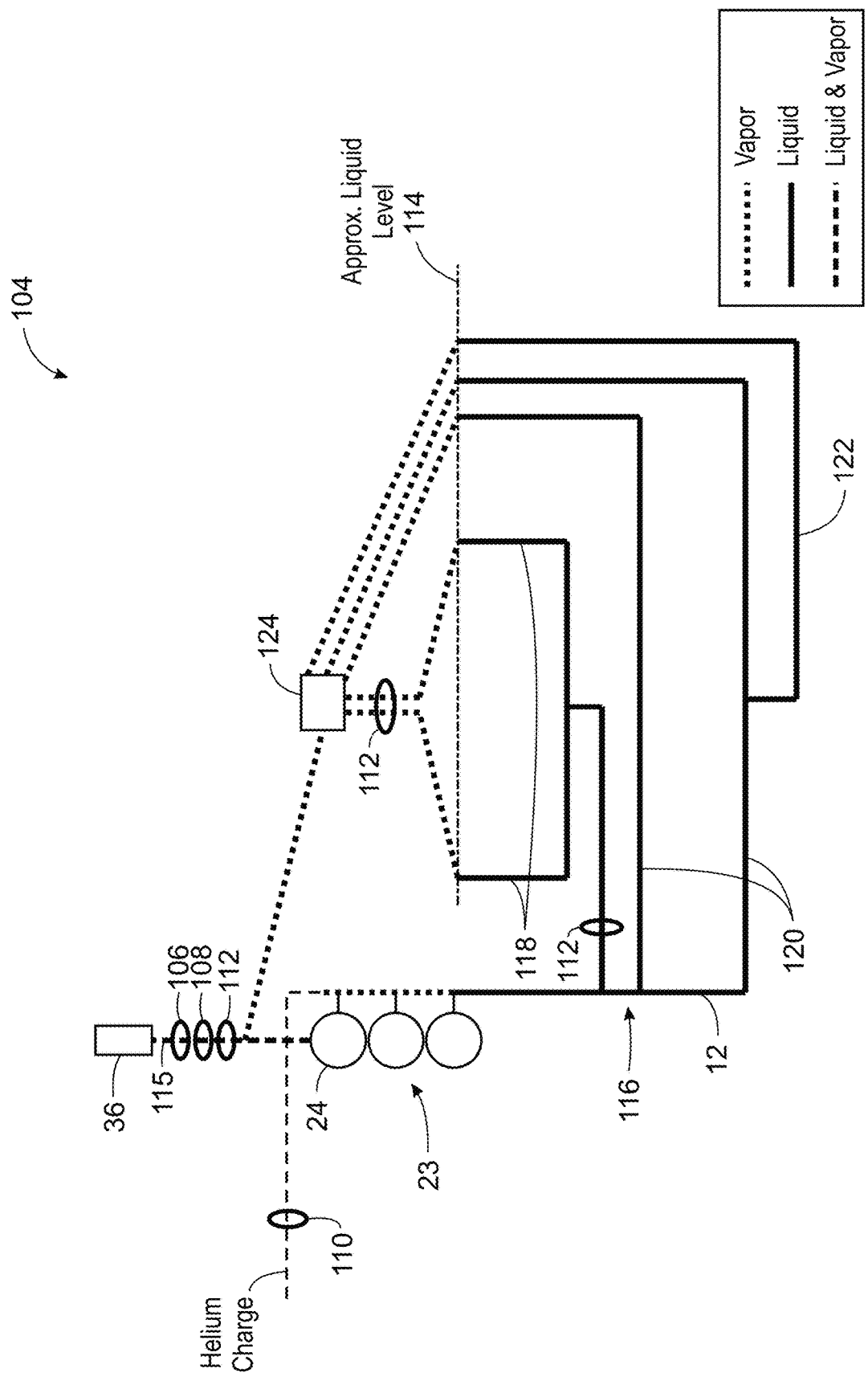
FIG. 7 is a liquid helium network for cooling a superconducting magnet of an MRI machine, in accordance with aspects of the present disclosure.

FIG. 7 is a liquid helium network 104 for cooling a superconducting magnet of an MRI machine. Annulus 106 represents an entry point through the thermal shield (e.g., thermal shield 54 in FIG. 2). Annulus 108 represents an entry point through the cryogenic vessel or helium vessel (e.g., cryogenic vessel 48 in FIG. 2). Annulus 110 represents the entry point or main penetration point for liquid helium to be provided to fill cryogenic vessel. The main penetration point may be heat sunk to first stage on bellows. Annuli 112 represent entry points through the bucking former (e.g., coil former 18 in FIG. 1). Dashed line 114 represents a level of liquid helium in the cryogenic vessel. The sealed cryogenic system liquid helium storage tanks 24 are located within the cryogenic vessel between the main and bucking formers. Space availability can dictate that the helium gas be stored under very high pressures. The gas will slowly turn into vapor and liquid as the magnet cools down from room temperatures. The recondenser 36 is located outside both the thermal shield and the cryogenic vessel. Each liquid helium storage tank 24 may be coupled to the recondenser 36 via respective tube 115 that extends from inside the cryogenic vessel to outside both the cryogenic vessel and the thermal shield.

As depicted, a network 116 of the cooling tubes 12 is disposed throughout the cryogenic vessel forming a sealed cryogenic system. The cooling tubes 12 may be thermally coupled to the coils and the cryogenic vessel. Tubes 118 represent cooing tubes 12 that are utilized for cooling the bucking coils (e.g., coils 22 in FIG. 1). Tubes 120 represent cooling tubes 12 that are utilized for cooling the main coils (e.g., coils 20 in FIG. 1). Tube 122 represents a cooling tube 12 utilized to cool the superconducting switch (e.g., superconducting switch 53 in FIG. 2). The liquid helium within the tubes may be converted into vapor upon heat transfer from the various coils and other components. The portion of the cooling tubes 12 may be fluidly coupled to a manifold 124 that combines the flow into a single tube for returning the vapor liquid helium to the recondenser 36.

Figure 8:
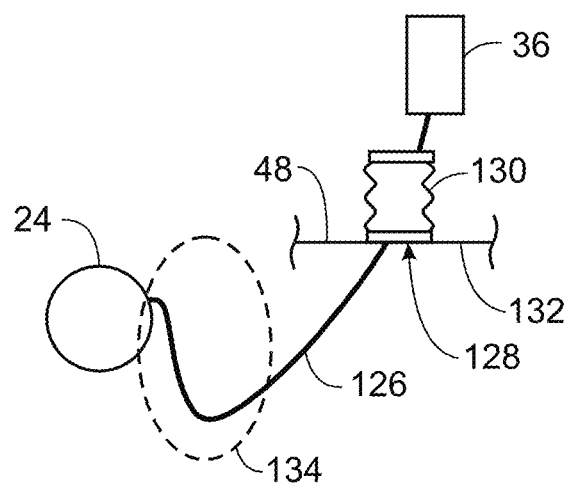
FIG. 8 is a schematic diagram of a vacuum feedthrough between a recondenser and a tank of the cooling system in FIG. 2 (e.g., bellows), in accordance with aspects of the present disclosure.
Figure 9:
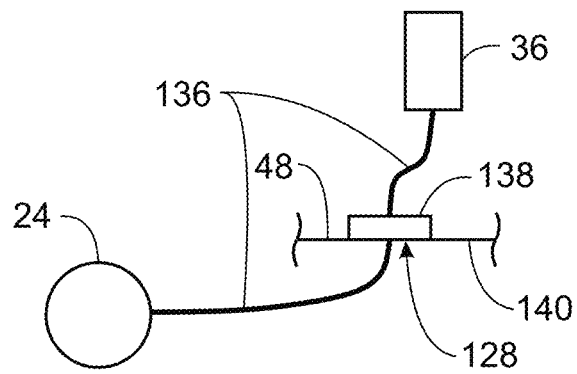
FIG. 9 is a schematic diagram of a vacuum feedthrough between a recondenser and a tank of the cooling system in FIG. 2 (e.g., bi-metallic interface), in accordance with aspects of the present disclosure.

Some tubes or conduits (e.g., the liquid/vapor line between the tanks 24 and the recondenser) may require passing through vacuum boundaries. These tubes or conduits would need vacuum feedthroughs (e.g. that form vacuum seals) eliminate vibration transmission from the coldhead and that compensate for thermal expansion differentials between the materials involved. FIGS. 8 and 9 describe different examples of vacuum feedthroughs to utilize to create the sealed low cryogenic system.

FIG. 8 is a schematic diagram of a vacuum feedthrough between the recondenser 36 and the tank 24 (e.g., liquid helium storage tank) of the cooling system 10 in FIG. 2 (e.g., bellows). As depicted, the recondenser 36 is located outside the cryogenic vessel 48 and the tank 24 is disposed within the cryogenic vessel 48 (see FIG. 2). The recondenser 36 is coupled to the tank 24 via a tube 126 (e.g., passageway 44 in FIG. 2). The tube 126 extends through an opening 128 in the cryogenic vessel 48. A bellows 130 is located at the opening 128 to form a vacuum feedthrough (e.g., to form a vacuum seal or boundary 132) for the tube 126 to extend through the opening 128. The bellows 130 is disposed along the tube 126 adjacent the opening 128. The tube 126 is a rigid tube. Also, the tube 126 includes a near horizontal strain relief curve (as indicated by reference numeral 134) adjacent the tank 24.

Figure 10:
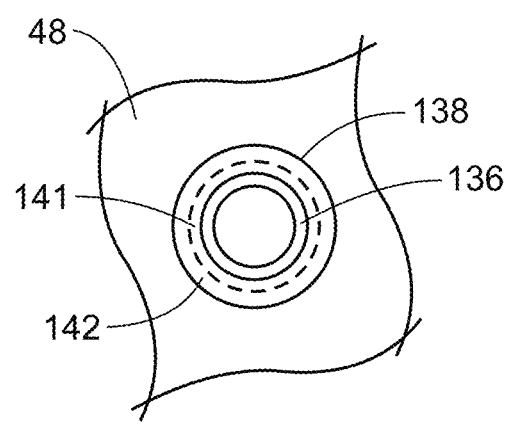
FIG. 10 is a schematic diagram of a bi-metallic interface coupled to a tube, in accordance with aspects of the present disclosure.

FIG. 9 is a schematic diagram of a vacuum feedthrough between the recondenser 36 and the tank 24 (e.g., bi-metallic interface) of the cooling system 10 in FIG. 2 (e.g., bellows). As depicted, the recondenser 36 is located outside the cryogenic vessel 48 and the tank 24 is disposed within the cryogenic vessel 48 (see FIG. 2). The recondenser 36 is coupled to the tank 24 via a tube 136 (e.g., passageway 44 in FIG. 2). The tube 136 extends through an opening 128 in the cryogenic vessel 48. A bi-metallic interface 138 is located at the opening 128 to form a vacuum feedthrough (e.g., to form a vacuum seal or boundary 140) for the tube 136 to extend through the opening 128. The bi-metallic interface 138 is welded to the cryogenic vessel 48. The tube 136 extends through the bi-metallic interface 138 so that the bi-metallic interface 138 is disposed about the tube 136. The tube 136 is a high pressure flexible tube. As depicted in FIG. 10, the bi-metallic interface 138 includes an inner metal layer 141 that interfaces with an outer surface of the tube 136 and an outer metal layer 142 that interfaces with the cryogenic vessel 48, and the inner metal layer 141 is made of a different metallic material than the outer metal layer 142. For example, the inner metal layer 141 may be made of stainless steel and the outer metal layer 142 may be made of aluminum.

Figure 11:
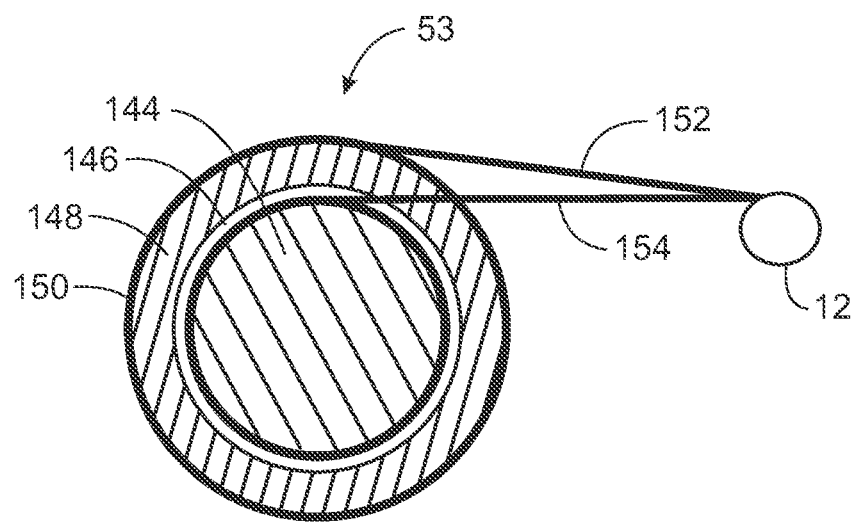
FIG. 11 is a schematic diagram of a superconducting switch, in accordance with aspects of the present disclosure.

FIG. 11 is a schematic diagram of the superconducting switch 53. The superconducting switch 53 is configured to operate at a temperature of 80 Kelvin or less. In particular, the superconducting switch 53 is configured for low cryogen operation. The superconducting switch 53 is both located within (e.g., see FIG. 2) and thermally isolated from the cryogenic vessel. The superconducting switch 53 is configured to switch between a resistive mode and a superconducting mode.

As depicted, the superconducting switch 53 includes a body 144. A thermoconductive metallic sheet 146 (e.g., copper sheet) is disposed about the body 144. The thermoconductive metallic sheet 146 enables switch temperature control. The superconducting switch 53 includes a blanket or cryogenic insulation 148 (e.g., Cryogel® Z) disposed about the thermoconductive metallic sheet 146. The blanket insulation 148 is configured to thermally isolate the superconducting switch 53 from the cryogenic vessel. The blanket insulation 148 functions well at low vacuum levels as disclosed herein. The superconducting switch 53 also includes a thermoconductive metallic sheet 150 (e.g., cooper sheet) disposed about the blanket insulation 148. The superconducting switch 53 is thermally coupled to the cooling tube 12. In particular, the thermoconductive metallic sheet 150 is coupled via thermal short 152. The superconducting switch 53 is also coupled to the cooling tube via a calibrated thermal shunt 154. The blanket insulation 148 and the thermoconductive metallic sheet 150 are configured to keep convection from being generated by the superconducting switch 53 during ramping of the superconducting magnet. The thermal isolation of the superconducting switch 53 enables the superconducting switch 53 to go to higher temperature under driving mode and thus low boil-off during ramping.

Figure 12:
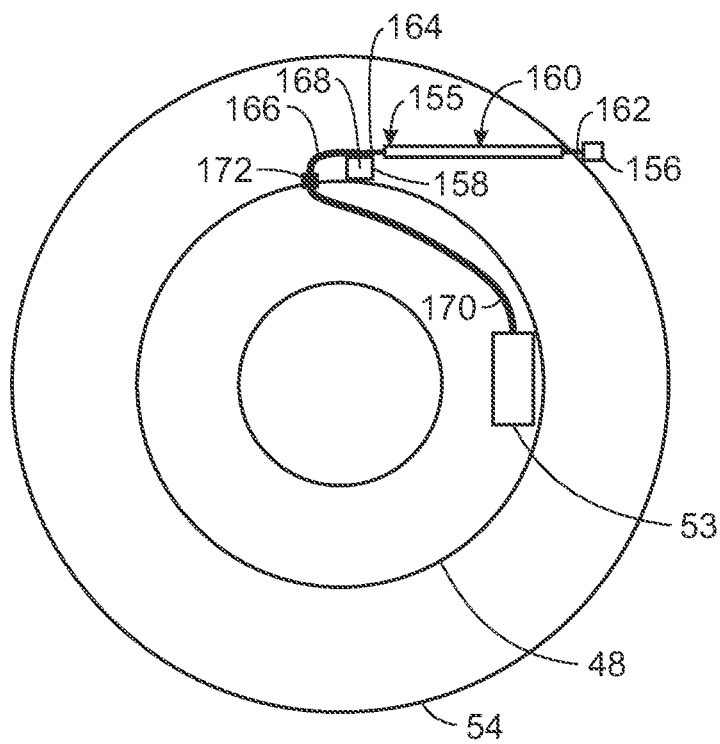
FIG. 12 is a schematic diagram of a current leads coupled to a superconducting switch, in accordance with aspects of the present disclosure.

To retroactively create the sealed low cryogenic system power leads including a high temperature superconducting wire need to be coupled to the superconducting switch. FIG. 12 is a schematic diagram of a current or power leads 155 coupled to the superconducting switch 53. As depicted, the superconducting switch 53 is located within the cryogenic vessel 48. A first heat station 156 (e.g., pad) is located at the thermal shield 54 (which is approximately 50 K) and a second heat station 158 (e.g., pad) is located at the cryogenic vessel 48 (e.g., at approximately 4 K). The first heat station 156 and the second heat station 158 are configured to provide thermal contacts and electrical isolation for the current or power leads 155 at the thermal shield 54 and the cryogenic vessel 48, respectively. The superconducting current or power leads 155 include a high temperature superconducting wire 160 (which functions as the ramp lead) located outside the cryogenic vessel 48. A first end 162 (e.g., cold end) of the high temperature superconducting wire 160 is coupled to the first heat station 156 at the thermal shield 54. A second end 164 (e.g., warm end) of the high temperature superconducting wire 160 is coupled to the second heat station 158 at the cryogenic vessel 48. Both ends 162, 164 of the high temperature superconducting wire 160 may be coated with alumina ceramic for further electrical isolation. The superconducting current or power leads 155 also includes a low temperature superconducting wire 166. The low temperature superconducting wire 166 has a first end 168 coupled to the second heat station 158 outside the cryogenic vessel 48. A second end 170 of the low temperature superconducting wire 166 is coupled to the superconducting switch 53 within the cryogenic vessel 48. The low temperature superconducting wire 166 passes from outside the cryogenic vessel 48 through an electrically isolated feedthrough 172 into the cryogenic vessel 48.

Figure 13:
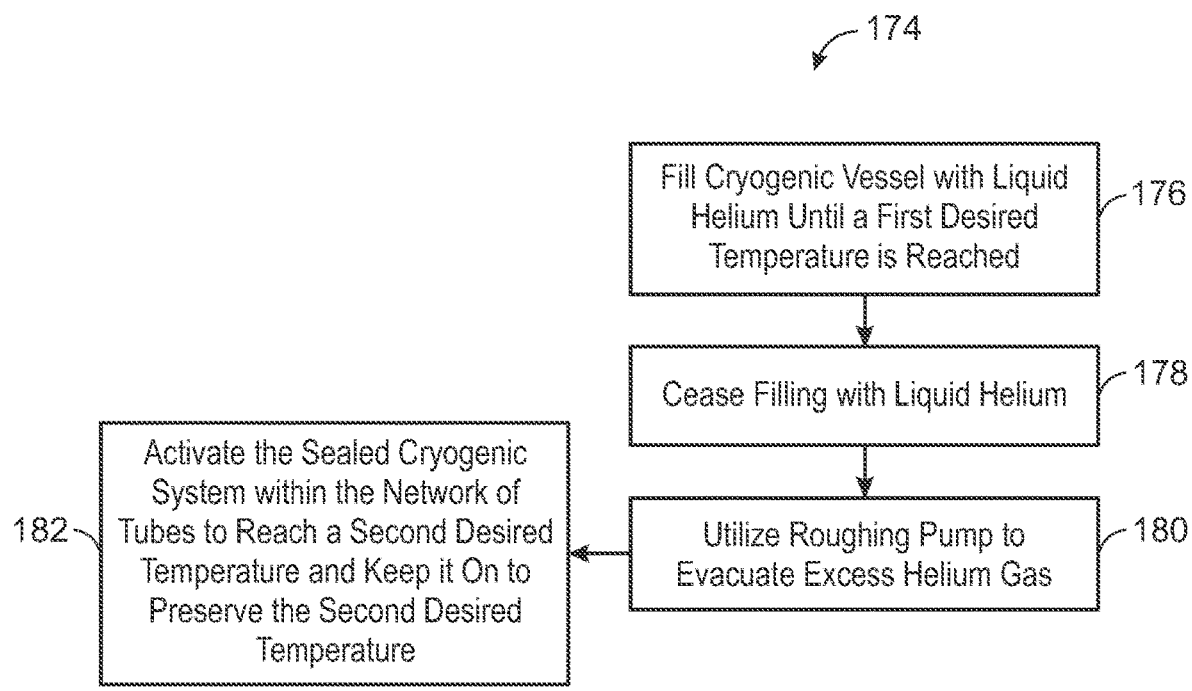
FIG. 13 is a flowchart of a method for cooling a superconducting magnet of a magnetic imaging system, in accordance with aspects of the present disclosure.

FIG. 13 is a flowchart of a method 174 for cooling a superconducting magnet for a magnetic resonance imaging system. The method 174 includes filling a sealed cryogenic vessel with liquid helium until a first desired temperature is reached for cooling the superconducting magnet having a plurality of coils disposed about a body of a coil support structure, wherein the superconducting magnet is disposed within the sealed cryogenic vessel (block 176). The method also includes ceasing filling the sealed cryogenic vessel with the liquid helium upon reaching the first desired temperature (block 178). The method further includes utilizing a roughing vacuum pump coupled to the sealed cryogenic vessel to evacuate excess helium gas after ceasing filling the sealed cryogenic vessel with the liquid helium (block 180). The method even further includes activating a sealed cryogenic system including a network of tubes disposed within the sealed cryogenic vessel by flowing a cryogen through the network of tubes to cool the superconducting magnet to a second desired temperature, wherein the second desired temperature is lower than the first desired temperature (block 182). The pressure in the sealed cryogenic vessel after evacuating the excess helium gas generates internal convection to ensure a uniform temperature distribution between the plurality of coils and the sealed cryogenic vessel. The pressure of the leftover gas after cooldown and pump can be in the tens of millitorr. This in conjunction with the internal convection enables the uniform temperature distribution. The method 174 enables the retrofitted sealed low cryogen system to cool the superconducting magnet quicker than a typical sealed low cryogen system. Indeed, the method 174 enables the retrofitted sealed low cryogen system to cool the superconducting magnet similar to helium bath cooled system. In certain embodiments, the superconducting magnet may be directly cooled to the second desired temperature only utilizing the flow of helium through the network of tubes (i.e., without initially utilizing a helium bath for cooling the superconducting magnet).

Figure 14:
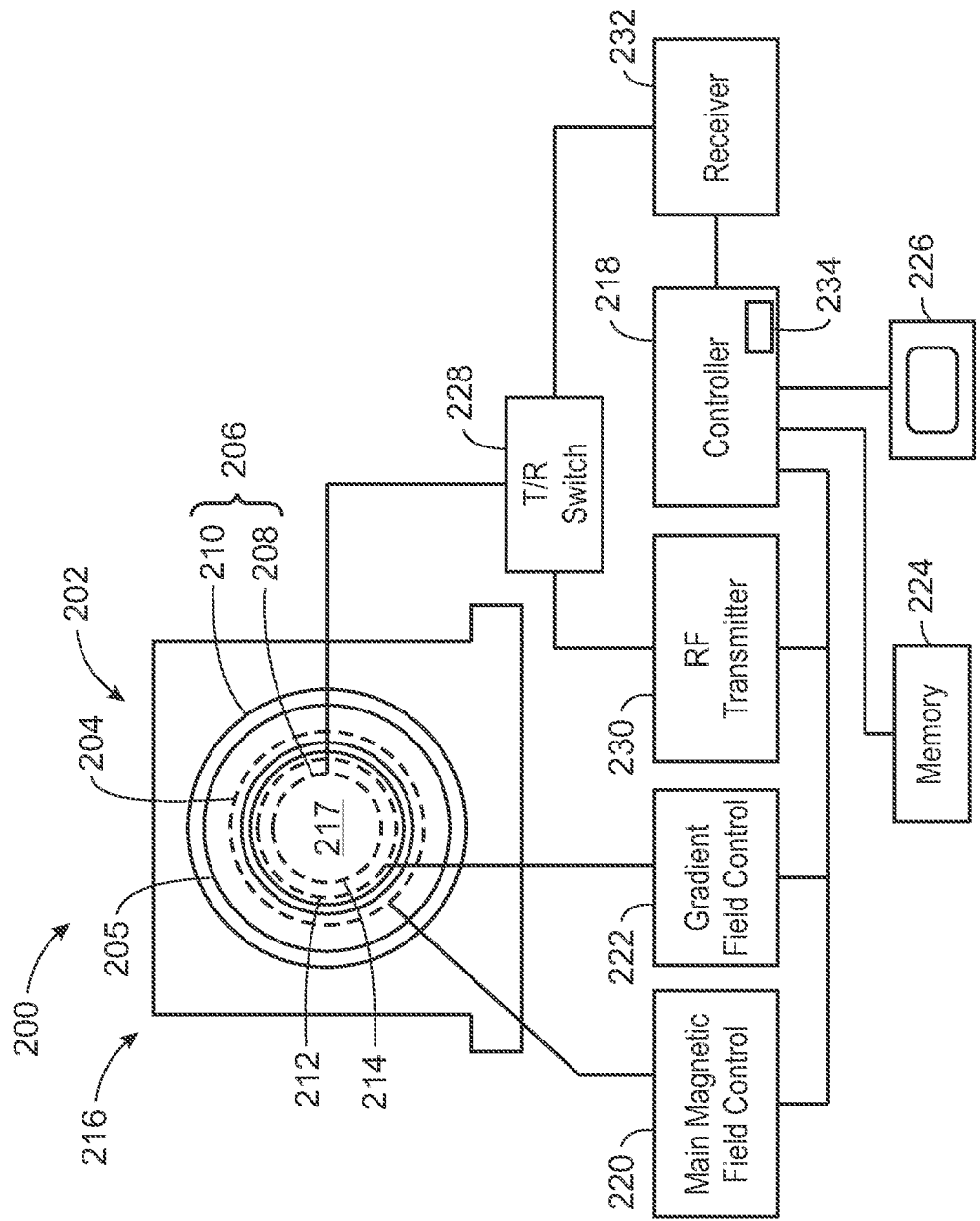
FIG. 14 is a schematic diagram of an example magnetic resonance system, in accordance with aspects of the present disclosure.

FIG. 14 illustrates a schematic block diagram of an example MR system 200 having the retrofitted sealed cryogen system disclosed herein. MR system 200 is used to obtain images or for spectroscopy applications of a subject. In the example embodiment, MR system 200 includes a magnet assembly 202 that includes a magnet 204. In some embodiments, magnet 204 is a superconducting magnet formed from a plurality of magnetic coils wound around a magnetic coil support or a coil former. Magnet 204 is configured to generate a polarizing magnetic field. Magnet assembly 202 may include a cryostat or cryogenic vessel 205 that surrounds magnet 204. Cryostat vessel 205 is typically filled with a cryogenic fluid or cryogen which is used to cool the superconducting coils into an extremely low temperature, e.g., 4 K, such that electric current continues to flow through the superconducting coils without electrical resistance to maintain a uniform and static magnetic field after a power supply is disconnected. Cryogen may be helium, hydrogen, neon, nitrogen, or any combination thereof, in a liquid form, a gaseous form, or a combination of liquid and gaseous form. Helium is described as an example cryogen. Other cryogen may be used in superconducting magnet assemblies described herein.

In the example embodiment, magnet assembly 202 may also include a thermal shield assembly 206 that enclose cryostat vessel 205 and magnet 204 therein. In one embodiment, thermal shield assembly 206 may include an inner thermal shield member 208 and an outer thermal shield member 210. Inner thermal shield member 208 is generally cylindrical in shape and is radially placed inside of magnet 204. Inner thermal shield member 208 is configured to prevent heat being radiated from a warm region where the subject is placed to a cold region where magnet 204 is placed. Outer thermal shield member 210 is arranged concentrically with respect to inner thermal shield member 208. Outer thermal shield member 210 may also have a generally cylindrical shape and is radially placed outside of magnet 204. Outer thermal shield member 210 is configured to prevent heat being radiated from environment into magnet 204. Thermal shield assembly 206 is made from metal materials, such as aluminum.

In the example embodiment, MR system 200 also includes a gradient coil assembly 212 placed inside of inner thermal shield member 208. Gradient coil assembly 212 is configured to selectively impose one or more gradient magnetic fields along one or more axes, such as x, y, or z axes. MR system 200 also includes radio frequency (RF) coil 214. RF coil 214 may be a transmitter coil, which is configured to transmit RF pulses. RF coil 214 may be a receiver coil, which is configured to detect MR signals from the subject. RF coil 214 may be a transmit and receive coil that transmits and also detect MR signals. Magnet assembly 202, gradient coil assembly 212, and body RF coil 214 are collectively referred to as a scanner assembly 216, because scanner assembly 216 forms into one unit and is in a scanner room. Scanner assembly 216 has a bore 217, where the subject is positioned during scanning. Scanner assembly 216 shown in FIG. 1 is a closed bore system, where the bore is cylindrical. Scanner assembly 216 may be magnet assemblies of other designs, such as an open-bore system, a dipolar electromagnet configuration, or a Hallbach configuration.

In the example embodiment, MR system 200 also includes a controller 218, a magnetic field control 220, a gradient field control 222, a memory 224, a display device 226, a transmit/receive (T/R) switch 228, an RF transmitter 230, and a receiver 232. In operation, a subject is placed in bore 217 on a suitable support, for example, a motorized table (not shown) or other patient table. Magnet 204 produces a uniform and static magnetic field $B_0$ across bore 217. Strength and homogeneity of the magnet field B0 in bore 217 and correspondingly in patient is controlled by controller 218 via magnetic field control 220, which also controls a supply of energized current to magnet 204. Gradient coil assembly 212 is energized by gradient field control 222 and is also controlled by controller 218, so that one or more gradient magnetic fields are imposed on the magnetic field $B_0$. RF coil 214 and a receive coil, if provided, are selectively interconnected to one of RF transmitter 230 or receiver 232, respectively, by T/R switch 228. RF transmitter 230 and T/R switch 228 are controlled by controller 218 such that RF field pulses or signals are generated by RF transmitter 230 and are selectively applied to the subject for excitation of magnetic resonance in the subject.

In the example embodiment, following application of the RF pulses, T/R switch 228 is again actuated to decouple RF transmit coil 214 from RF transmitter 230. The detected MR signals are in turn communicated to controller 218 which may organize the MR signals in a particular format for storage in memory 224. Controller 218 includes a processor 234 that controls the processing of the MR signals to produce signals representative of an image of the patient, which are transmitted to display device 226 to provide a visual display of the image.

Technical effects of the disclosed subject matter include providing for converting existing bath cooled magnets (especially those with fiberglass composite structures) to sealed low cryogen systems while keeping the support structure, coil configuration, and cryostat (e.g., helium vessel) nearly intact, while replacing a main switch of the superconducting magnet with a switch configured for low cryogen operation and adding superconducting current leads. In addition, technical effects of the disclosed subject matter include providing for a liquid helium network that allows the cooling of the sealed helium vessel directly. Further, the technical effects of the disclosed subject matter include providing for feedthrough configurations (e.g., for tubes through the sealed helium vessel) that eliminate vibration transmission from the coldhead and that compensate for thermal expansion differentials between the materials involved. Even further, the technical effects of the disclosed subject matter include enabling a faster cooldown for the superconducting magnet disposed in the sealed cryogenic vessel (e.g., from 1 to 3 weeks to 1 to 3 days) which is equivalent to cooldown for a bath cooled magnet. Still further, technical effects of the disclosed subject matter includes reducing helium consumption (e.g., due to eliminating helium addition during a lifetime of the magnet) and, thus, the costs associated with consumption of helium. Yet further, technical effects of the disclosed subject matter include eliminating the need for a quench vent pipe.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A superconducting magnet system for a magnetic resonance imaging system, comprising:
   a coil support structure having a body; and
   a superconducting magnet having a plurality of coils disposed about the body of the coil support structure; and
   a helium vessel encompassing the coil support structure and the superconducting magnet; and
   a cooling system comprising:
      a network of tubes disposed within the helium vessel and configured to transport helium within, wherein the network of tubes is retroactively thermally coupled to the plurality of coils;
      a liquid helium storage system located within the helium vessel;
      a helium recondenser located outside the helium vessel to recondense vapor helium to liquid helium; and
      one or more tubes coupling the helium storage system to the helium recondenser, wherein where the one or more tubes pass through the helium vessel is retroactively vacuum sealed to make the helium vessel a sealed helium vessel, wherein the cooling system is configured to keep a uniform temperature between the sealed helium vessel and the plurality of coils; and
      wherein each coil of the plurality of coils is thermally coupled to a respective tube of the network of tubes via a thermocoupling assembly, wherein the thermocoupling assembly comprises a flat thermoconductive metal strap disposed on a respective coil, a thermoconductive metallic wire overwrap wound about both a portion of the flat thermoconductive metallic strap and the respective coil, and ends of the flat thermoconductive metal strap are coupled to a thermoconductive metallic plate coupled to the respective tube.

2. The superconducting magnet system of claim 1, further comprising a respective bellows located where each respective tube of the one or more tubes pass through the helium vessel, wherein each respective bellows forms a vacuum seal and is coupled to the respective tube of the one or more tubes, and the one or more tubes are rigid.

3. The superconducting magnet system of claim 1, further comprising a respective bi-metallic interface disposed about each tube of the one or more tubes where each respective tube of the one or more tubes passes through the helium vessel, wherein each respective bi-metallic interface forms a vacuum seal, and the one or more tubes are flexible.

4. The superconducting magnet system of claim 3, wherein each respective bi-metallic interface comprises an inner metal layer that interfaces with the respective tube and an outer metal layer that interfaces with the helium vessel, and the inner metal layer is made of a different metallic material than the outer metal layer.

5. The superconducting magnet system of claim 1, wherein the thermocoupling assembly comprises a thermoconductive metallic sheet wrapped around the respective tube, and the thermoconductive metallic plate is coupled to the thermoconductive metallic sheet.

6. The superconducting magnet system of claim 1, further comprising a superconducting switch configured to operate at a temperature of 80 Kelvin or less, wherein the superconducting switch is both located within and thermally isolated from the helium vessel, the superconducting switch is configured to switch between a resistive mode and a superconducting mode, and the superconducting switch is thermally coupled to a respective tube of the network of tubes.

7. The superconducting magnet system of claim 6, further comprising power leads coupled to the superconducting switch, wherein the power leads comprise a high temperature superconducting wire coupled to a heat sink located outside the helium vessel, wherein an end of the high temperature superconducting wire coupled to the heat sink is electrically isolated, and wherein the power leads comprise a low temperature superconducting wire having a first end coupled to the heat sink and a second end coupled to the superconducting switch, and the low temperature superconducting wire passes from outside the helium vessel through an electrically isolated feedthrough into the helium vessel.

8. The superconducting magnet system of claim 1, wherein the body of the coil support structure is made of fiberglass composite.

9. A method for cooling a superconducting magnet for a magnetic resonance imaging system, comprising:
  filling a sealed cryogenic vessel with liquid helium until a first desired temperature is reached for cooling the superconducting magnet having a plurality of coils disposed about a body of a coil support structure, wherein the superconducting magnet is disposed within the sealed cryogenic vessel;
  ceasing filling the sealed cryogenic vessel with the liquid helium upon reaching the first desired temperature;
  utilizing a roughing vacuum pump coupled to the sealed cryogenic vessel to evacuate excess helium gas after ceasing filling the sealed cryogenic vessel with the liquid helium; and
  activating a sealed cryogenic system comprising a network of tubes disposed within the sealed cryogenic vessel by flowing a cryogen through the network of tubes to cool the superconducting magnet to a second desired temperature, wherein the second desired temperature is lower than the first desired temperature.

10. The method of claim 9, wherein pressure in the sealed cryogenic vessel after evacuating the excess helium gas generates internal convection to ensure a uniform temperature distribution between the plurality of coils and the sealed cryogenic vessel.

11. The method of claim 9, wherein each coil of the plurality of coils is retroactively thermally coupled to a respective tube of the network of tubes via a thermocoupling assembly, wherein the thermocoupling assembly comprises a flat thermoconductive metal strap disposed on a respective coil, a thermoconductive metallic wire overwrap wound about both a portion of the flat thermoconductive metallic strap and the respective coil, and ends of the flat thermoconductive metal strap are coupled to a thermoconductive metallic plate coupled to the respective tube.

12. The method of claim 9, wherein the magnetic resonance imaging system comprises a cooling system for the superconducting magnet, wherein the cooling system comprises a liquid helium storage system located within the sealed cryogenic vessel, a helium recondenser located outside the cryogenic vessel to recondense vapor helium to liquid helium, and one or more tubes coupling the helium storage system to the helium recondenser, wherein where the one or more tubes pass through the sealed cryogenic vessel is retroactively vacuum sealed to a make a cryogenic vessel the sealed cryogenic vessel, and wherein the cooling system is configured to keep a uniform temperature between the sealed helium vessel and the plurality of coils.

13. The method of claim 12, wherein the cooling system comprises a respective bi-metallic interface disposed about each tube of the one or more tubes where each respective tube of the one or more tubes passes through the sealed cryogenic vessel, wherein each respective bi-metallic interface forms a vacuum seal, and the one or more tubes are flexible.

14. The method of claim 9, wherein the magnetic resonance imaging system comprises a cooling system for the superconducting magnet, wherein the cooling system comprises a superconducting switch configured to operate at a temperature of 80 Kelvin or less, wherein the superconducting switch is both located within and thermally isolated from the sealed cryogenic vessel, the superconducting switch is configured to switch between a resistive mode and a superconducting mode, and the superconducting switch is thermally coupled to a respective tube of the network of tubes.

15. The method of claim 9, wherein the cooling system comprises power leads coupled to the superconducting switch, wherein the power leads comprise a high temperature superconducting wire coupled to a heat sink located outside the sealed cryogenic vessel, wherein an end of the high temperature superconducting wire coupled to the heat sink is electrically isolated, and wherein the power leads comprise a low temperature superconducting wire having a first end coupled to the heat sink and a second end coupled to the superconducting switch, and the low temperature superconducting wire passes from outside the sealed cryogenic vessel through an electrically isolated feedthrough into the sealed cryogenic vessel.

16. A magnetic resonance imaging (MRI) system, comprising:
  a coil support structure having a body, wherein the body of the coil support structure is made of fiberglass composite; and
  a superconducting magnet having a plurality of coils disposed about the body of the coil support structure; and
  a helium vessel encompassing the coil support structure and the superconducting magnet; and
  a cooling system comprising:
    a network of tubes disposed within the helium vessel and configured to transport helium within, wherein the network of tubes is retroactively thermally coupled to the plurality of coils;
    a liquid helium storage system located within the helium vessel;

a helium recondenser located outside the helium vessel to recondense vapor helium to liquid helium; and one or more tubes coupling the helium storage system to the helium recondenser, wherein where the one or more tubes pass through the helium vessel is retroactively vacuum sealed to make the helium vessel a sealed helium vessel, wherein the cooling system is configured to initially cool the superconducting magnet to a first desired temperature via filling the sealed helium vessel with liquid helium and to subsequently cool the superconducting magnet to a second desired temperature via the helium flowing through the network of tubes, wherein the second desired temperature is lower than the first desired temperature; and wherein each coil of the plurality of coils is thermally coupled to a respective tube of the network of tubes via a thermocoupling assembly, wherein the thermocoupling assembly comprises a flat thermoconductive metallic strap disposed on a respective coil, a thermoconductive metallic plate disposed about a portion of the flat thermoconductive metallic strap, and ends of the flat thermoconductive metallic strap are coupled to an additional thermoconductive metallic plate coupled to the respective tube.

17. A superconducting magnet system for a magnetic resonance imaging system, comprising:

a coil support structure having a body; and a superconducting magnet having a plurality of coils disposed about the body of the coil support structure; and a helium vessel encompassing the coil support structure and the superconducting magnet; and a cooling system comprising:

a network of tubes disposed within the helium vessel and configured to transport helium within, wherein the network of tubes is retroactively thermally coupled to the plurality of coils;

a liquid helium storage system located within the helium vessel;

a helium recondenser located outside the helium vessel to recondense vapor helium to liquid helium;

one or more tubes coupling the helium storage system to the helium recondenser, wherein where the one or more tubes pass through the helium vessel is retroactively vacuum sealed to make the helium vessel a sealed helium vessel, wherein the cooling system is configured to keep a uniform temperature between the sealed helium vessel and the plurality of coils; and a superconducting switch configured to operate at a temperature of 80 Kelvin or less, wherein the superconducting switch is both located within and thermally isolated from the helium vessel, the superconducting switch is configured to switch between a resistive mode and a superconducting mode, and the superconducting switch is thermally coupled to a respective tube of the network of tubes; and wherein the superconducting switch comprises a blanket insulation disposed about a body of the switch and configured to thermally isolate the superconducting switch from the helium vessel, the superconducting switch comprises a thermoconductive metallic sheet disposed about the blanket insulation and thermally connected to the respective tube, and wherein the blanket insulation and the thermoconductive metallic sheet are configured to keep convection from being generated by the superconducting switch during ramping of the superconducting magnet.

* * * * *